United States Patent [19]

Flolid

[11] Patent Number: 4,849,683
[45] Date of Patent: Jul. 18, 1989

[54] LAMP DRIVER CIRCUIT WITH CONTROLLED POWER OVER A RANGE OF POWER SUPPLY VOLTAGES

[75] Inventor: Gregory W. Flolid, Prospect Heights, Ill.

[73] Assignee: Motorola, Inc., Schaumburg, Ill.

[21] Appl. No.: 280,783

[22] Filed: Dec. 7, 1988

[51] Int. Cl.$^4$ ............................................. G05F 1/565
[52] U.S. Cl. .................................... 323/284; 323/285; 323/908
[58] Field of Search ............... 323/282, 284, 285, 351, 323/908; 307/270

[56] References Cited

U.S. PATENT DOCUMENTS 3,579,090 5/1971 Madsen ................................. 323/284
4,048,665 9/1977 Lia et al. ............................. 323/284
4,513,241 4/1985 Bowman ............................. 323/908

Primary Examiner—Peter S. Wong
Attorney, Agent, or Firm—Jim Pristelski

[57] ABSTRACT

A lamp driver circuit for supplying and controlling power to a lamp from a power supply subject to voltage variations. A semiconductor switch is disposed in series with the lamp and a current sensing resistor. A capacitor integrates the lamp current during ON time of the switch and power supply voltage during OFF time. A voltage comparator with hysteresis responds to the capacitor voltage to control the conductive state of the switch. Above a nominal supply voltage, the driver circuit begins to pulse width modulate the power supplied to the lamp with a duty cycle inversely proportional to the square of the supply voltage to maintain constant power to the lamp. As the supply voltage rises above a second predetermined level, the driver circuit ceases to supply power.

5 Claims, 1 Drawing Sheet

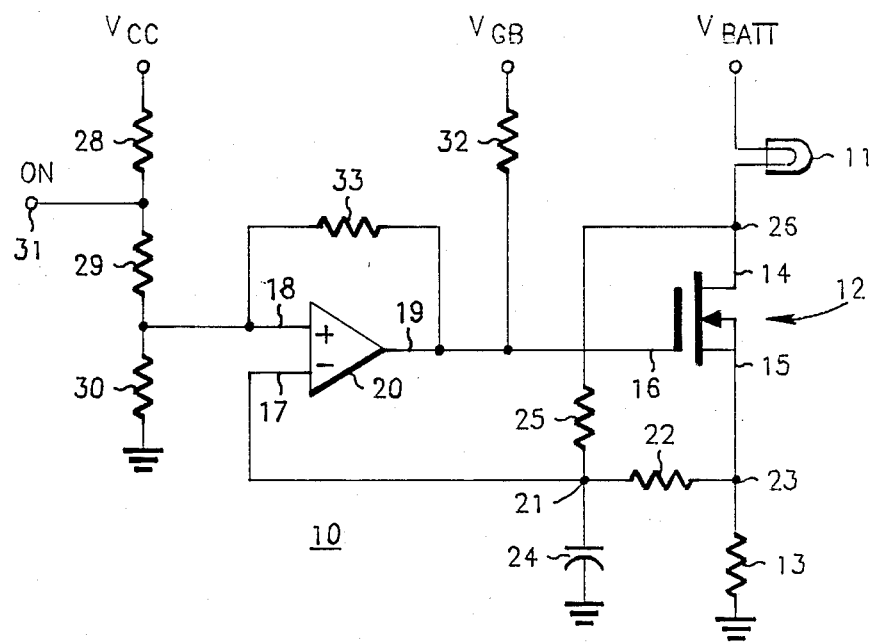

LAMP DRIVER CIRCUIT WITH CONTROLLED POWER OVER A RANGE OF POWER SUPPLY VOLTAGES

BACKGROUND OF THE INVENTION

This invention generally relates to lamp driver circuits for controlling power supplied to a lamp from a power supply subject to voltage variations and, more particularly, to a lamp driver circuit which senses the current through, and the voltage applied to the lamp to control the power supplied to the lamp, and which pulse-width modulates the power supplied to the lamp when the voltage of the power supply rises above a nominal level.

Current sensing circuits are known to the power supply art. Such circuits generally limit the maximum current which the power supply will deliver under potentially destructive conditions to avoid failure of the power supply. A typical example is to limit the power supply output current when a short circuit is imposed across the output of the power supply. Similarly, various kinds of over-voltage protection circuits exist.

However, in vehicular applications, the battery voltage from which many lamps are operated can vary over significant ranges for a number of reasons. One such reason is that the alternator output current available at low idle speeds is limited. Another reason is that vehicular power systems are typically temperature compensated to regulate the battery voltage at different levels depending upon the ambient temperature. It is also well known that voltage regulator failure can result in an abnormally high voltage level in some vehicular systems. In some vehicular applications, especially in heavier trucks, there is a need to operate from a 24 volt DC system, instead of from the more prevalent 12 volt DC system.

It is also well known that incandescent lamps commonly used in vehicles have a relatively narrow operating voltage range. As a example, a lamp rated at 12 volts will experience burn-out of the filament, or unacceptably short operating life, if such a lamp is operated in a 24 volt system. Conversely, a lamp rated at 24 volts will typically produce an unacceptably low level of illumination if operated in a 12 volt system.

SUMMARY OF THE INVENTION

Is is therefore a principal object of this invention to control the amount of power supplied to a lamp from a power source which may vary over a range of voltages, or to permit a lamp of a fixed voltage rating to operate in different voltage systems.

It is another object of the present invention to cause periodic switching of the power supplied to the lamp, in a pulse-width mode, when the power supply voltage is above a first predetermined level so as to supply substantially constant power to the lamp, independent of voltage variations above the predetermined voltage level.

It is yet another object of the present invention to cease to deliver power to the lamp when the power supply voltage rises to a second predetermined level which exceeds the first predetermined voltage level.

Briefly, the present invention provides a lamp driver circuit for controlling power supplied from a power supply to a lamp, typically an incandescent lamp, in an environment in which the power supply experiences fluctuations in its output voltage. A semiconductor switch is disposed in series with the lamp between the power supply and ground. Current sensing means limits the amount of in-rush current that the lamp filament receives upon turn on. The current sensing means determines whether the power supply voltage is above or below a first predetermined voltage level. If the power supply voltage is below the first predetermined voltage level, a driving means responds to the sensing means to render the semiconductive switch substantially fully conductive to continuously supply the power supply voltage to the lamp. However, if the power supply voltage rises above the first predetermined voltage level, the driving means causes periodic switching, in a pulse-width modulated mode, of the semiconductive switch between cut-off and substantially fully conductive conditions to control the amount of power supplied to the lamp. If the voltage of the power supply rises above a safe operating level, even under the pulse-width modulated condition, the driver circuit causes the semiconductive switch to cease delivering power to the lamp. For example, in a vehicular system, the first predetermined voltage level could be 14 volts and the second predetermined voltage level could be 36 volts. Under these conditions, the lamp driver circuit continuously supplies current to the lamp if the power supply voltage remains below 14 volts. If the power supply voltage is in the range of 14 to 36 volts, the driver circuit is then in the pulse-width modulating mode so as to deliver substantially constant power to the lamp. If the power supply voltage rises above 36 volts, the lamp driver circuit ceases to deliver power to the lamp.

BRIEF DESCRIPTION OF THE DRAWING

The drawing FIGURE is a schematic diagram of the lamp driver circuit of the present invention.

DESCRIPTION OF THE PREFERRED EMBODIMENT

With reference to the drawing FIGURE, there is shown a lamp driver circuit, generally designated 10, for supplying and controlling power delivered to a lamp 11 from a power supply $V_{BATT}$. The lamp 11 is typically an incandescent lamp which is selected to have a nominal voltage rating for operation from a power source having a compatible voltage level. However, as noted above, the battery voltage in vehicular applications can vary over temperature, operating conditions, or failure of any portion of the charging system. Additionally, in some vehicular applications, the lamp 11 may have to operate from a nominal 24 volt system, instead of from a nominal 12 volt system. A semiconductive switch 12 is disposed in series between lamp 11 and ground through a current sensing resistor 13. In this instance, switch 12 is a field effect transistor (FET), with the drain terminal 14 of the FET connected to one end of the filament of the lamp 11 and the source terminal 15 of the FET connected to one lead of resistor 13. The other lead of resistor 13 is connected to ground. The value of resistor 13 is selected depending upon the desired nominal current through lamp 11. For example, it maybe desired to select the value of resistor 13 to develop a voltage level of about 0.8 volts across resistor 13 when lamp 11 is at its rated current level.

The gate terminal 16 of FET 12 is controlled by a driving means in the form of a comparator 20. Comparator 20 is of the type having differential input terminals including an inverting terminal 17 and a non-inverting terminal 18. An output terminal 19 of comparator 20 is directly connected to gate terminal 16 of FET 12.

Inverting terminal 17 of comparator 20 is connected to a node 21. Node 21 has a signal which includes both current sensing information and voltage feedback information. A resistor 22 is connected between node 21 and to a node 23 between the source terminal 15 of FET 12 and resistor 13. A capacitor 24 is between node 21 and ground. A voltage feedback resistor 25 is connected between node 21 and a node 26, situated between the drain terminal 14 of FET 12 and one end of the filament of lamp 11. A voltage feedback signal is developed at node 21 by virtue of the voltage divider action of resistors 25, 22 and 13, connected in series between lamp 11 and ground. Capacitor 24 filters the voltage feedback information developed by resistor 22 and the current sense information developed by resistor 13.

The non-inverting terminal 18 of comparator 20 is connected to a resistive divider consisting of a string of resistors 28, 29 and 30 connected in series between a supply voltage $V_{cc}$ and ground. Supply $V_{cc}$ is typically about 5 volts and may be an independent voltage source, or may be developed separately, as from a Zener diode. Non-inverting input 18 of comparator 20 is connected directly to the junction between resistors 29 and 30. An on/off control of the lamp driver circuit 10 may be provided at the junction of resistors 28 and 29. When the signal at the on/off control terminal 31 is in an open condition, the lamp driver circuit 10 is enabled. If terminal 31 is referenced to ground or another suitable low voltage level, the lamp driver circuit 10 will be disabled. That is, FET 12 is cutoff and no current is conducted through the lamp 11.

A pull up resistor 32 is connected between the output 19 of comparator 20 and another voltage source $V_{GB}$. $V_{GB}$ is typically about 15 volts. The output 19 of comparator 20 typically sinks current from resistor 32 to create a low voltage level at the gate terminal 16 of FET 12. Under such circumstances, FET 12 is in a cutoff or non-conductive condition. When comparator 20 ceases to sink current, resistor 32 pulls up the output voltage to a high level on the gate terminal 16 of FET 12, which causes the FET to become substantially fully conductive to sink current from supply voltage $V_{BATT}$ through lamp 11, through FET 12 and through resistor 13 to illuminate lamp 11. A resistor 33 is connected between output 19 of comparator 20 and non-inverting input 18 of comparator 20 to provide a hysteresis which will result in a pulse-width modulated operation of lamp driver circuit 10 as further described below. Representative values of the components of the lamp driver circuit 10 are as follows:

| | |
|---|---|
| FET 12 = MTD10N05E | Resistor 25 = 470K |
| Resistor 13 = 16 | Resistor 28 = 3.6K |
| Comparator 20 = LM2901 | Resistor 29 = 3.9K |
| Resistor 22 = 10K | Resistor 30 = 1K |
| Capacitor 24 = 0.1 MFD | Resistor 32 = 47K |
| | Resistor 33 = 470K |

The lamp driver circuit 10 operates as follows. When the voltage supply $V_{BATT}$ is below about 14 volts DC, the driver circuit 10 will operate to continuously sink current from lamp 11 to ground. During this mode, the bias established at the non-inverting input 18 of comparator 20 by the resistor divider 28, 29 and 30, is greater than that established at the inverting input 17. The bias at inverting input 17 is established by lamp current being conducted through FET 12 to establish a bias across current sensing resistor 13. During this mode of operation, the drain terminal 14 of FET 12 is at a continuously low potential, so that voltage feedback resistor 25 provides virtually no voltage feedback signal across resistor 22. The current feedback and voltage feedback signals are summed at node 21 and directly presented to terminal 17 of comparator 20. Thus, the output terminal 19 of operational comparator 20 is at a high level, permitting resistor 32 to pull up the voltage on gate terminal 16 of FET 12 to thereby keep FET 12 in a continuously conductive mode.

When the voltage supply VBATT is at a voltage range of about 14 to 36 volts DC, increased lamp current through lamp 11 will establish a higher potential across current sensing resistor 13. The sum of the signals at node 21 and, hence, at inverting input 17 of comparator 20 will begin to exceed the potential established at non-inverting input 18. At this point, comparator 20 will switch its output at terminal 19 to a low level, thereby pulling down the potential on gate 16 of FET 12 to cause FET 12 to cease conduction and to go into its cutoff mode. As soon as FET 12 switches to its cutoff mode, current through current sensing resistor 13 drops substantially to nearly zero. At the same time as the potential on drain 14 of FET 12 rises, voltage feedback resistor 25 attempts to establish a voltage feedback signal across resistor 22. However, the potential at node 21 does not change immediately due to the presence of capacitor 24. Capacitor 24 begins to discharge toward a lower potential through resistors 22 and 13. The discharge will continue until the potential at input 17 of comparator 20 is once again lower than the potential on input terminal 18. At this point, the comparator will again switch its output 19 to a high level to cause conduction in FET 12.

This periodic switching cycle will continue so long as the power supply voltage remains in this range of voltage levels. The amount of hysteresis between the switching levels, as seen at node 21, is substantially dependent upon the value of feedback resistor 33 across the output 19 and non-inverting input 18 of the comparator 20. For the component values selected, as disclosed above, the hysteresis will be about 0.4 volts. The time in which FET 12 is in a conductive or ON mode can be approximated by the following equation:

$$t_{on} \frac{R22 \times C24 \times 0.4v}{I_{LAMP} \times R13 - V_{LO}}$$

where 0.4 V is the amount of hysteresis, $I_{LAMP}$ is the lamp current, $V_{LO}$ is the potential at the low end of the hysteresis band, R22 is the resistive value of resistor 22 and C24 is the capacitive value of capacitor 24. In this instance, $V_{LO}$ is 0.8 volts.

The potential at node 21 across capacitor 24 will ramp up during the ON time and will eventually exceed the potential at the non-inverting input 18 of comparator 20; $V_{HI}=1.2$ volts. Comparator 20 will then cause FET 12 to switch to cutoff. The time that it takes capacitor 24 to charge to $V_{HI}$ is inversely proportional to the voltage across sense resistor 13. The higher the current through resistor 13, the shorter the FET 12 will be conductive. The time in which FET 12 is non-conductive or in its OFF mode can be approximated by the equation:

$$t_{off} = \frac{R22 \times C24 \times 0.4v}{V_{HI} - V_{BATT} \times K}$$

where $V_{HI}$ is the potential at the high end of the hysteresis band and K is the voltage feedback ratio. In this instance, $V_{HI} = V_{LO} + 0.4$ volts $= 1.2$ volts and $$K = \frac{R22}{R22 + R25}$$

During the OFF time, the potential across capacitor 24 begins to discharge through resistors 22 and 13 toward the lower comparator threshold level $V_{LO}$. However, resistor 25 provides voltage feedback which is proportional to the battery voltage $V_{BATT}$. Thus, the higher that $V_{BATT}$ rises, the longer that it will take for capacitor 24 to discharge to the lower comparator threshold $V_{LO}$.

Thus, it can be shown that as the battery voltage increases, the ON time is shortened and the OFF time is lengthened. This results in a duty cycle which is inversely proportional to the square of the battery voltage. Of course, without the switching action of lamp driver circuit 10, the power delivered to lamp 11 is proportional to the square of the battery voltage. If the battery voltage were to double, the instantaneous power in lamp 11 would quadruple. Lamp driver circuit 10 compensates for the increased battery voltage by pulse-width modulating at a duty cycle of approximately ¼. Driver circuit 10 permits a 12 volt rated lamp to be used in a 24 volt system, and the brightness or illumination of the bulb remains substantially constant despite the increased or varying battery voltage. Thus, a 12 volt rated bulb can be used in either 12 volt DC or 24 volt DC system with the present invention.

When the power supply voltage $V_{BATT}$ exceeds about 36 volts DC, voltage feedback provided by resistors 25 and 22 will keep the potential at node 21 (and therefore at inverting input 17 of comparator 20) at a sufficiently high potential that the output 19 of comparator 20 will continuously remain in a low output condition to keep the FET 12 in a non-conductive condition. Under these circumstances, no current is conducted through lamp 11 and no power is therefore delivered to the lamp.

Driver circuit 10 is quite efficient because FET 12 is fully conductive when $V_{BATT}$ is less than 14 volts, and FET 12 switches between full conduction and cutoff when $V_{BATT}$ is in the range of 14 to 36 volts. Very little power is therefore lost or dissipated in FET 12.

Due to the presence of current sensing resistor 13, the driver circuit 10 will also limit in-rush current to lamp 11 when the circuit is first turned on. It is of course known that substantial in-rush current is a major source of lamp filament failure.

It will now be appreciated that the lamp driver circuit 10 may have additional applications, such as in controlling the power delivered to electrical heater filaments.

While an embodiment of the invention has been shown and described, it will be obvious to those skilled in the art that changes and modifications may be made without departing from the invention in its broader aspects, and, therefore, the aim of the appended claims is to cover all such changes and modifications as fall within the true spirit and scope of the invention.

I claim:

1. A lamp driver circuit for controlling power supplied from a power supply to a lamp, said lamp driver circuit comprising:
   a semiconductive switch disposed in series with the lamp between the power supply and ground;
   sensing means to sense whether the power supply is above or below a first predetermined voltage; and
   driving means responsive to the sensing means to render the semiconductive switch substantially fully conductive when the power supply voltage is below the first predetermined voltage, and to cause periodic switching of the semiconductive switch between cutoff and substantively fully conductive conditions when the power supply voltage is above the first predetermined voltage to thereby control the amount of power supplied to the lamp when the voltage of the power supply is above the first predetermined voltage.

2. The lamp driver circuit as in claim 1 wherein the driving means causes substantially constant power to be delivered to said lamp when the power supply is above the first predetermined voltage.

3. The lamp driver circuit as in claim 1 wherein the driving means pulse width modulates the semiconductor switch to decrease the amount of time that the semiconductor switch is in its substantially conductive condition as the voltage of the power supply rises above the first predetermined voltage.

4. The lamp driver circuit as in claim 3 wherein the time that the semiconductive switch is in its substantially fully conductive condition is inversely proportional to the square of the voltage of the power supply.

5. The lamp driver circuit as in claim 1 wherein when said power supply is at a voltage level which exceeds a second predetermined level; with the second predetermined level at a voltage greater than said first predetermined level; said sensing means causes said driving means to stop periodically switching said semiconductive switch, thereby keeping the semiconductive switch cutoff so that power is no longer supplied to the lamp.

* * * * *